United States Patent [19]

Taft et al.

[11] Patent Number: 5,441,914
[45] Date of Patent: Aug. 15, 1995

[54] METHOD OF FORMING CONDUCTIVE INTERCONNECT STRUCTURE

[75] Inventors: Robert C. Taft; Craig D. Gunderson; Arkalgud R. Sitaram, all of Austin, Tex.

[73] Assignee: Motorola Inc., Schaumburg, Ill.

[21] Appl. No.: 236,076

[22] Filed: May 2, 1994

[51] Int. Cl.⁶ .................. H01L 21/283; H01L 21/314
[52] U.S. Cl. .................... 437/189; 437/193; 437/200; 437/228; 437/229; 437/241; 148/DIG. 1; 148/DIG. 12
[58] Field of Search ............... 437/228, 229, 192, 193, 437/200, 241, 189; 156/656, 653, 659.1, 660; 148/DIG. 12, DIG. 1

[56] References Cited

U.S. PATENT DOCUMENTS

| | | | |
|---|---|---|---|
| 4,065,730 | 12/1977 | Minden | 331/94.5 H |
| 4,476,483 | 10/1984 | Van de Van et al. | |
| 4,488,166 | 12/1984 | Lehrer | |
| 4,495,222 | 1/1985 | Anderson et al. | 427/89 |
| 4,569,122 | 2/1986 | Chan | |
| 4,617,252 | 10/1986 | Cordes, III et al. | 430/272 |
| 5,194,712 | 3/1993 | Jones | 219/121.67 |
| 5,263,076 | 11/1993 | Cuthbert et al. | 156/657 |
| 5,288,558 | 2/1994 | Nöthe | 428/426 |
| 5,346,586 | 9/1994 | Keller | 156/656 |

FOREIGN PATENT DOCUMENTS

| | | |
|---|---|---|
| 1-241125 | 9/1989 | Japan . |
| 5-55130 | 3/1993 | Japan . |

OTHER PUBLICATIONS

Wolf, S., et al., Silicon Processing, vol. 1, 1986, Lattice Press, pp. 175–182, 384–386.

G. Czech et al., "Reduction of Linewidth Variation for the Gate Conductor Level by Lithography Based on a New Antireflective Layer", Microelectronic Engineering, Apr. 21, 1993, No. 1/4, pp. 51–56.

Yurika Suda et al., "A new anti-reflective layer for deep UV lithography," SPIE vol. 1674 Optical/Laser Microlithography V, Aug. 1992, pp. 350–361.

Tohru Ogawa et al., "Novel ARC optimization Methodology for KrF excimer laser lithography at low K1 factor," SPIE vol. 1674 Optical/Laser Microlithography v, Aug. 1992, pp. 362–375.

Tohru Ogawa et al., "Practical resolution enhancement effect by new complete anti-reflective layer in KrF laser lithography," SPIE vol. 1927 Optical/Laser Microlithography VI, Mar. 1993, pp. 263–274.

Fujii et al., "Dual (n+/p+) Polycide Interconnect Technology using poly-Si/WSi2/poly-Si Structure and Post B+ Implantation," IEDM Dec. 1992, pp. 845–848.

*Primary Examiner*—T. N. Quach
*Attorney, Agent, or Firm*—Kent J. Cooper

[57] ABSTRACT

In one embodiment, delamination of a patterned silicon nitride anti-reflective layer (26) from an underlying patterned tungsten silicide layer (32), is prevented by forming a thin silicon layer (30) between the patterned tungsten silicide layer (32) and the overlying patterned silicon nitride anti-reflective layer (26).

22 Claims, 3 Drawing Sheets

METHOD OF FORMING CONDUCTIVE INTERCONNECT STRUCTURE

CROSS-REFERENCE TO RELATED APPLICATION

The present application is related to the following commonly assigned, co-pending patent application: "METHOD AND STRUCTURE FOR FORMING AN INTEGRATED CIRCUIT PATTERN ON A SEMICONDUCTOR SUBSTRATE," by Roman et al., Ser. No. 08/086,268, filed on Jul. 6, 1993, U.S. Pat. No. 5,378,659.

FIELD OF THE INVENTION

This invention relates generally to integrated circuits, and more generally to a method for forming a conductive interconnect structure in an integrated circuit.

BACKGROUND OF THE INVENTION

The semiconductor industry's continuing drive toward integrated circuits with ever decreasing geometries, coupled with its pervasive use of highly reflective interconnect materials, such as polysilicon, aluminum, refractory metals, and metal silicides, has led to increased photolithographic patterning problems. Unwanted reflections front these underlying interconnect materials, during the photoresist patterning process, cause the interconnect photoresist pattern and the resulting interconnect to be distorted. This problem is further compounded when photolithographic imaging tools having ultraviolet (UV) and deep ultraviolet (DUV) exposure wavelengths are used to generate the photoresist patterns.

One technique proposed to minimize reflections from an underlying reflective interconnect material is to form an anti-reflective coating over it prior to photoresist patterning. Adhesion between the anti-reflective coating and the underlying interconnect material, however, is often poor and the anti-reflective coating delaminates from the underlying interconnect material, and as a result, integrated circuit yields are degraded. Therefore, the formation of interconnects with an overlying anti-reflective coating is difficult to achieve, and the fabrication of advanced integrated circuits with submicron interconnect geometries is limited.

Accordingly, a need exists for a method that allows interconnects to be formed in an integrated circuit with an anti-reflective coating.

SUMMARY OF THE INVENTION

The previously mentioned problems with existing methods for forming a conductive interconnect in an integrated circuit are overcome by the present invention. In one embodiment of the invention, a semiconductor substrate is provided. A dielectric layer is then formed overlying the semiconductor substrate. A conductive metal layer is then formed overlying the dielectric layer. A silicon layer is then formed overlying the conductive metal layer. A capping layer is then formed overlying the silicon layer. The capping layer is then etched to form a remaining portion of the capping layer. The conductive metal layer is then etched to form the conductive interconnect, wherein the remaining portion of the capping layer overlies the conductive interconnect. Other aspects of the invention involve conductive interconnect structures formed with this method, as well as those formed with the other methods disclosed herein.

These and other features, and advantages, will be more clearly understood from the following detailed description taken in conjunction with the accompanying drawings. It is important to point out that the illustrations may not necessarily be drawn to scale, and that there may be other embodiments of the present invention which are not specifically illustrated.

DETAILED DESCRIPTION OF A PREFERRED EMBODIMENT

Figure 1:
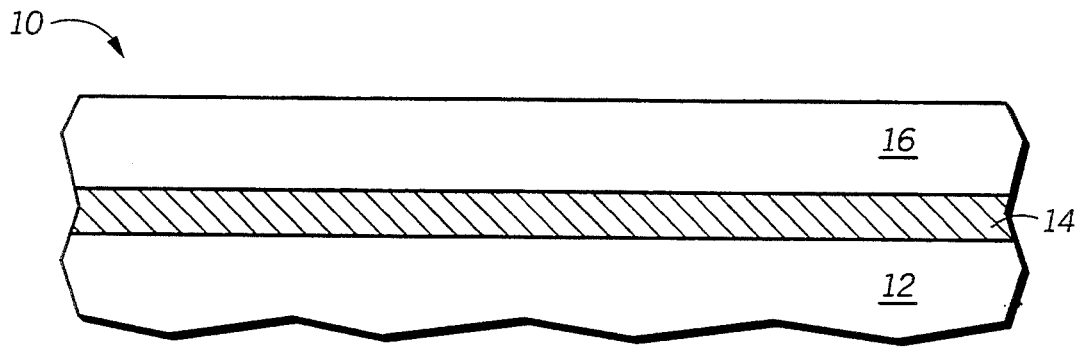
FIGS. 1–5 illustrate, in cross-section, process steps in accordance with one embodiment of the invention.

FIGS. 1 through 5 illustrate, in cross-section, process steps in accordance with one embodiment of the invention, wherein a conductive interconnect is formed in an integrated circuit. Shown in FIG. 1 is a portion 10 of an integrated circuit structure comprising a semiconductor substrate 12, a dielectric layer 14, and a silicon layer 16. Semiconductor substrate 12 is preferably a monocrystalline silicon substrate. Alternatively, semiconductor substrate 12 may also be a silicon on insulator substrate, a silicon on sapphire substrate, or the like. In one embodiment dielectric layer 14 is a gate dielectric layer and preferably has a thickness ranging from about 4 to about 20 nanometers. Alternatively, in another embodiment dielectric layer 14 is an interlevel dielectric layer and preferably has a thickness ranging from about 50 to about 1500 nanometers. If dielectric layer 14 is a gate dielectric layer, then semiconductor substrate 12 is preferably thermally oxidized to form dielectric layer 14. It should be appreciated, however, that other dielectric materials, such as silicon oxynitride or chemical vapor deposited silicon dioxide may also be used to form a gate dielectric layer. If dielectric layer 14 is an interlevel dielectric layer then dielectric layer 14 is preferably a doped or undoped silicon dioxide layer that is deposited using conventional chemical vapor deposition, plasma deposition, or spin-on deposition techniques, or the like. It should be appreciate, however, that other dielectric materials, such as silicon nitride or polyimide may also be used to form an interlevel dielectric layer. Following the formation of dielectric layer 14, a silicon layer 16 is formed overlying dielectric layer 14. In a preferred embodiment silicon layer 16 is a doped layer of polysilicon and preferably has a thickness ranging from 50 to 400 nanometers. For example, in one embodiment the polysilicon layer has a thickness of about 100 nanometers. Alternatively, silicon layer 16 may also be an undoped layer of polysilicon or a doped or undoped layer of amorphous silicon. Silicon layer 16 is preferably formed using conventional chemical vapor deposition techniques, and may be doped using conventional implantation or diffusion techniques.

Figure 2:
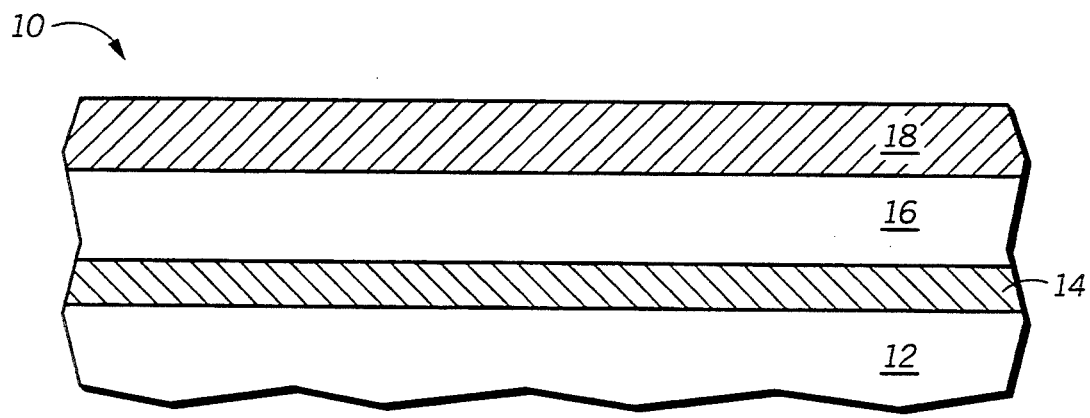

In FIG. 2, a conductive metal layer 18 is then formed overlying silicon layer 16. In a preferred embodiment conductive metal layer 18 is a tungsten silicide layer having a thickness ranging from 50 to 300 nanometers. For example, in one embodiment the tungsten silicide layer may have a thickness of about 100 nanometers.

Alternatively, conductive metal layer 18 may be another metal silicide, such as cobalt silicide, titanium silicide, molybdenum silicide, platinum silicide, nickel silicide, palladium silicide or it may be a layer of tungsten or molybdenum. Conductive metal layer 18 may be formed using conventional sputtering or chemical vapor deposition techniques. Alternatively, conductive metal layer 18 may also be formed using conventional sputtering or chemical vapor deposition techniques in combination with conventional annealing techniques. For example, a metal, such as titanium, cobalt, platinum, et cetera, may be sputter deposited onto silicon layer 16 and then subsequently annealed in a furnace or in a rapid thermal annealing system to form a metal silicide layer. In addition, it should also be appreciated that metal silicide films, which are sputter or chemical vapor deposited, may be annealed in a furnace or a rapid thermal annealing after deposition in order to reduce their sheet resistance.

Figure 3:
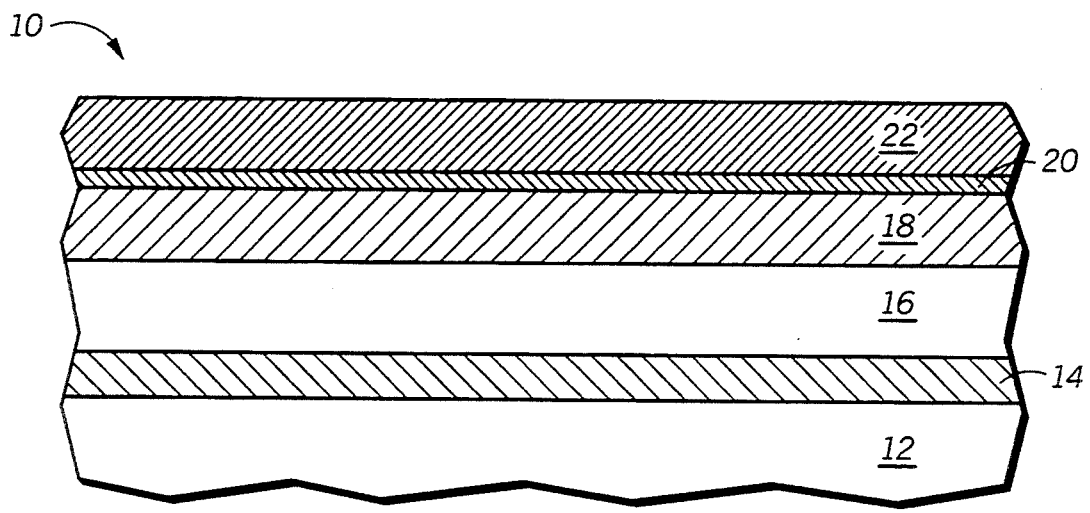

In FIG. 3, a silicon layer 20 is then formed overlying conductive metal layer 18. Silicon layer 20 is preferably a layer of amorphous silicon having a thickness ranging from 5 to 100 nanometers. For example, in one embodiment the amorphous silicon layer has a thickness of about 30 nanometers. Alternatively, silicon layer 20 may be a layer of polysilicon having a thickness ranging from 5 to 100 nanometers. Silicon layer 20 is preferably formed using conventional chemical vapor deposition techniques. After silicon layer 20 has been formed, a capping layer 22 is then formed overlying silicon layer 20. It is important to note that silicon layer 20 acts as glue layer between capping layer 22 and underlying conductive metal layer 18, and therefore delamination or peeling of capping layer 22 from conductive metal layer 18 during subsequent processing is minimized. Capping layer 22 preferably has a thickness ranging from 5 to 300 nanometers, and in one embodiment it is an insulating nitride layer such as silicon nitride, silicon oxynitride, silicon-rich silicon nitride, or the like, wherein the insulating nitride layer also serves as an anti-reflective layer for a subsequent photolithographic process. Alternatively, capping layer 22 may be a conductive film such as titanium nitride or another insulating film such as silicon carbide. Capping layer 22 may be formed using conventional sputtering, chemical vapor deposition, or plasma deposition techniques. For example, insulating nitride layers, such as silicon nitride, silicon oxynitride, and silicon-rich silicon nitride may be deposited using conventional low pressure chemical vapor deposition techniques or conventional plasma-enhanced chemical vapor deposition techniques. In addition, it is important to note that if silicon layer 16 is an amorphous silicon layer, then it may be converted to polysilicon during subsequent processing. For example, capping layer 22 may be deposited at a temperature that causes amorphous silicon to recrystallize.

Figure 4:
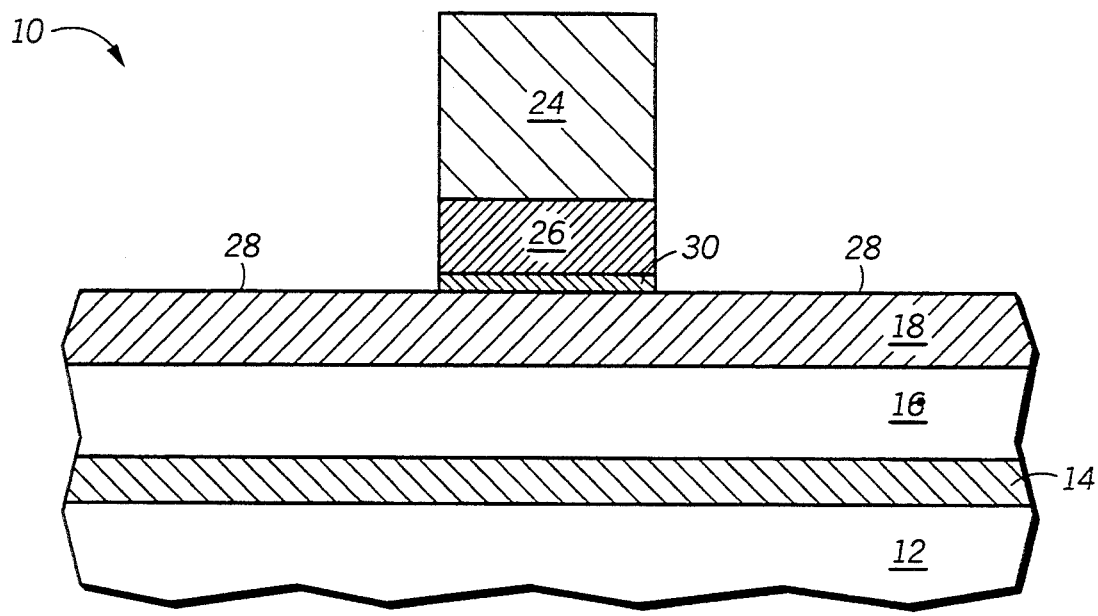

In FIG. 4, a patterned masking layer 24 is then formed overlying capping layer 22. Capping layer 22 is then etched to leave a remaining portion 26 of capping layer 22 underlying patterned masking layer 24. In addition, underlying silicon layer 20 is also etched to form a remaining portion 30 and an exposed portion 28 of conductive metal layer 18. Patterned masking layer 24 is preferably a layer of photoresist, which has been patterned using conventional photolithographic techniques. Capping layer 20 and silicon layer 20 are preferably etched using conventional anisotropic plasma etch techniques. For example, if capping layer 20 is an insulating nitride layer, such as silicon nitride, then capping layer 22 and silicon layer 20 may be anisotropically etched using a plasma etch chemistry comprising carbon tetrafluoride ($CF_4$) and Freon-23 ($CHF_3$). It should also be appreciated, however, that other plasma etch chemistries may be used to etch capping layer 22 and silicon layer 20. In addition, it should also be noted that underlying silicon layer 20 need not be etched when capping layer 22 is patterned. For example, an etch process that is selective with respect to silicon layer 20 may also be used to pattern capping layer 22.

Figure 5:
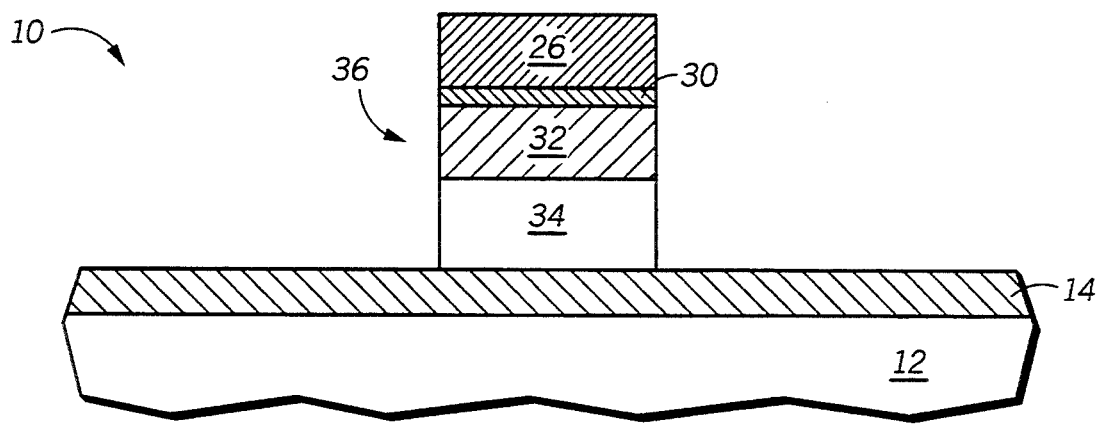

In FIG. 5, conductive metal layer 18 and silicon layer 16 are then etched to form a conductive interconnect 36, wherein conductive interconnect 36 comprises remaining portion 30 of silicon layer 20, a remaining portion 32 of conductive metal layer 18, and a remaining portion 34 of silicon layer 16. Conductive layer 18 and silicon layer 16 are preferably etched using conventional anisotropic plasma etching techniques. In accordance with a preferred embodiment, wherein conductive metal layer 18 is tungsten silicide, and silicon layer 16 is polysilicon, the tungsten silicide layer is etched first using a plasma etch chemistry comprising sulfur hexafluoride ($SF_6$) and hydrogen bromide (HBr) and then the underlying polysilicon layer is etched using a plasma etch chemistry comprising chlorine ($Cl_2$) and hydrogen bromide (HBr). It should be appreciated, however, that other etch chemistries may also be used to form conductive interconnect 36, and that conductive interconnect 36 may be formed using a single etch chemistry or with multiple etch chemistries. In addition, it should also be appreciated that if capping layer 22 is patterned selectively with respect to silicon layer 20, then silicon layer 20 may also be patterned when conductive metal layer 18 and silicon layer 16 are patterned. After conductive interconnect 36 has been formed, patterned masking layer 24 is then removed using conventional stripping techniques, and the resulting conductive interconnect structure is shown in FIG. 5, wherein remaining portion 26 of capping layer 22 overlies conductive interconnect 36. It is important to note that remaining portion 30 of silicon layer 20 acts as glue layer between remaining portion 26 of capping layer 22 and remaining portion 32 of conductive metal layer 18, and therefore delamination or peeling of remaining portion 26 from remaining portion 32 during subsequent processing is minimized. In addition, it should also be appreciated that remaining portion 26 may also be used as a hard mask and that patterned masking layer 24 may be removed before conductive metal layer 18 and silicon layer 16 are patterned.

Figure 6:
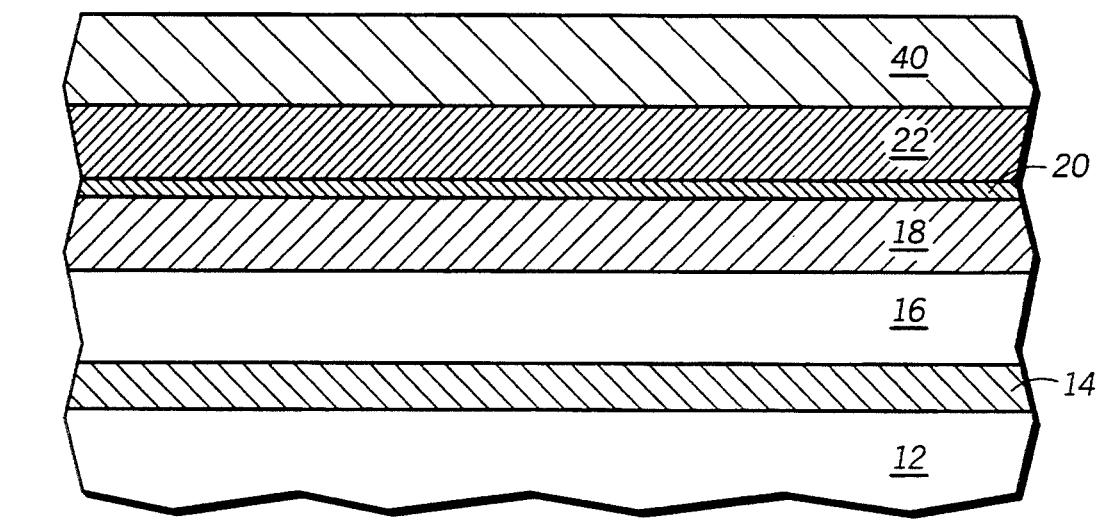
FIGS. 6–8 illustrates, in cross-section, process steps in accordance with an alternative embodiment of the invention, wherein like reference numerals designate identical or corresponding parts throughout the several views
Figure 7:
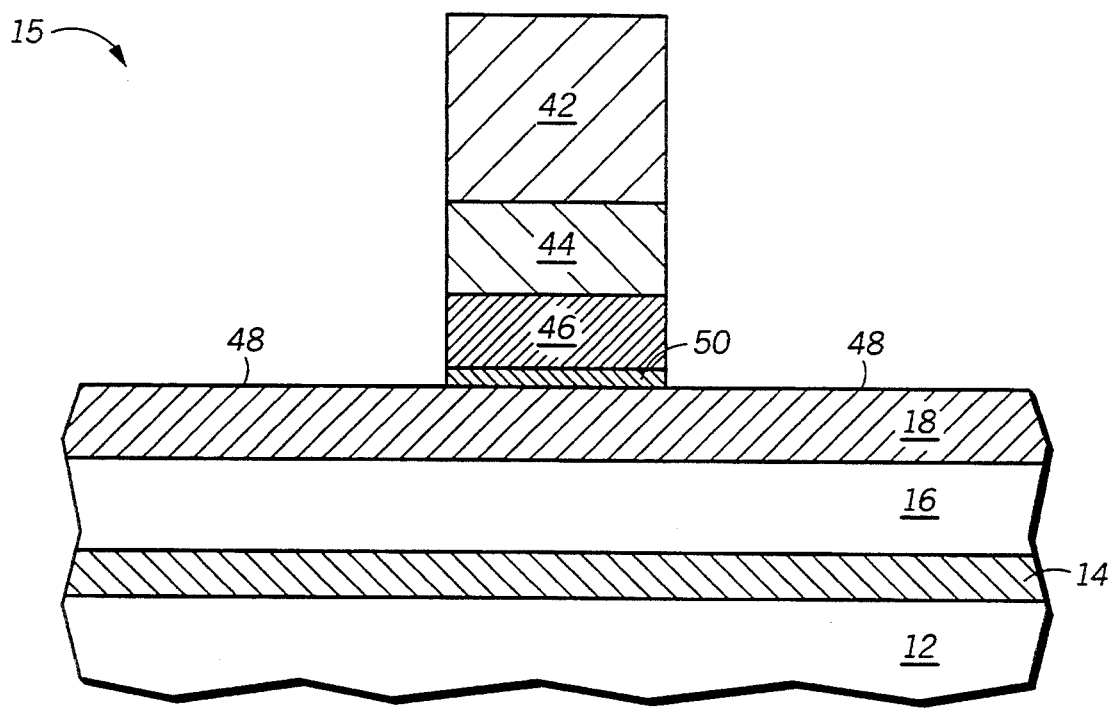
Figure 8:
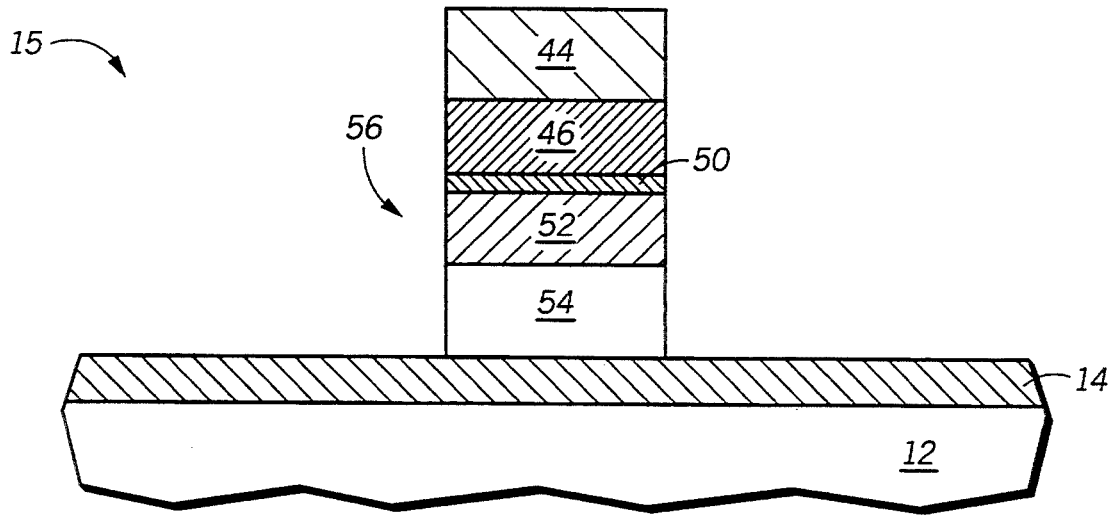

FIGS. 6 through 8 illustrate, in cross-section, process steps in accordance with an alternative embodiment of the invention, wherein a conductive interconnect is formed in an integrated circuit. Shown in FIG. 6 is a portion 15 of an integrated circuit structure that is analogous to that shown in FIG. 3, wherein after capping layer 22 has been formed an oxide layer 40 is formed overlying capping layer 22. Oxide layer 40 preferably has a thickness ranging from 5 to 300 nanometers, and is preferably an undoped silicon dioxide layer formed using conventional chemical vapor deposition or plasma deposition techniques.

In FIG. 7, a patterned masking layer 42 is then formed overlying oxide layer 40. Oxide layer 40 and capping layer 22 are then etched to leave a remaining portion 44 of oxide layer 40 and a remaining portion 46 of capping layer 22 underlying patterned masking layer 42. In addition, underlying silicon layer 20 is also etched to form a remaining portion 50 and to form an exposed portion 48 of conductive metal layer 18. Patterned masking layer 42 is preferably a layer of photoresist, which has been patterned using conventional photolithographic techniques. Oxide layer 40, capping layer 20, and silicon layer 20 are preferably etched using conventional anisotropic plasma etch techniques. For example, if capping layer 20 is an insulating nitride layer, such as silicon nitride, then oxide layer 40, capping layer 20, and silicon layer 20 may be anisotropically etched using a plasma etch chemistry comprising carbon tetrafluoride ($CF_4$) and Freon-23 ($CHF_3$). It should also be appreciated, however, that other plasma etch chemistries may be used to etch oxide layer 40, capping layer 22, and silicon layer 20, and that they may be patterned using multiple etch chemistries. In addition, it should also be noted that silicon layer 20 need not be etched when capping layer 22 is patterned. For example, an etch process that is selective with respect to silicon layer 20 may also be used to pattern capping layer 22.

In FIG. 8, conductive metal layer 18 and silicon layer 16 are then etched to form a conductive interconnect 56, wherein conductive interconnect 56 comprises remaining portion 50 of silicon layer 20, a remaining portion 52 of conductive metal layer 18, and a remaining portion 54 of silicon layer 16. Conductive layer 18 and silicon layer 16 are preferably etched using conventional anisotropic plasma etching techniques. In accordance with a preferred embodiment, wherein conductive metal layer 18 is tungsten silicide, and silicon layer 16 is polysilicon, the tungsten silicide layer is etched first using a plasma etch chemistry comprising sulfur hexafluoride ($SF_6$) and hydrogen bromide (HBr) and then the underlying polysilicon layer is etched using a plasma etch chemistry comprising chlorine ($Cl_2$) and hydrogen bromide (HBr). It should be appreciated, however, that other etch chemistries may also be used to form conductive interconnect 156, and that conductive interconnect 56 may be formed using a single etch step or with multiple etch steps. In addition, it should also be appreciated that if capping layer 22 is patterned selectively with respect to silicon layer 20, then silicon layer 20 may also be patterned when conductive metal layer 18 and silicon layer 16 are patterned. After conductive interconnect 156 has been formed, patterned masking layer 42 is then removed using conventional stripping techniques, and the resulting conductive interconnect structure is shown in FIG. 8, wherein remaining portions 44 and 46 overlie conductive interconnect 56. It is important to note that remaining portion 150 of silicon layer 20 acts as glue layer between remaining portion 46 of capping layer 22 and remaining portion 152 of conductive metal layer 18, and therefore delamination or peeling of remaining portion 46 from remaining portion 152 during subsequent processing is minimized. In addition, it should also be appreciated that remaining portion 44 may also be used as a hard mask and that patterned masking layer 42 n-ray be removed before conductive metal layer 18 and silicon layer 16 are patterned.

The foregoing description and illustrations contained herein demonstrate many of the advantages associated with the present invention. In particular, it has been revealed that adhesion between a capping layer or an anti-reflective layer and an underlying conductive metal layer may be improved by forming a silicon glue layer between the capping layer or the anti-reflective layer and the underlying conductive metal layer. More specifically, a silicon glue layer formed between a patterned anti-reflective layer or a patterned capping layer and an underlying conductive interconnect minimizes peeling of the patterned anti-reflective layer or capping layer during subsequent processing. Moreover, the silicon glue layer does not adversely effect the photolithographic process that is used to define the interconnect photoresist pattern. Furthermore, conventional process equipment may be used to form the silicon glue layer. Yet another advantage is that the present invention allows submicron interconnects to be fabricated in advanced integrated circuits.

Thus it is apparent that there has been provided, in accordance with the invention, a method for forming a conductive interconnect in an integrated circuit that fully meets the need and advantages set forth previously. Although the invention has been described and illustrated with reference to specific embodiments thereof, it is not intended that the invention be limited to these illustrative embodiments. Those skilled in the art will recognize that modifications and variations can be made without departing from the spirit of the invention. For example, in certain applications silicon layer 16 may be optional and conductive metal layer 18 may be formed directly overlying dielectric layer 14. In addition, in some applications an opening may be formed within dielectric layer 14 so that the conductive interconnect may make electrical contact to an underlying interconnect or doped region. Moreover, the invention is not limited to the specific etch chemistries recited herein. It is envisioned that other etch chemistries may also be used to form conductive interconnect 36, and to pattern capping layer 22. Furthermore, the invention is not limited to the specific layer thicknesses given herein. It is also important to note that the present invention is not limited in any way to those materials specifically described. Although preferred materials have been recited, it is envisioned that numerous materials are suitable for each of the elements of the present invention. Moreover, in certain applications capping layer 22 may not serve as an anti-reflective layer. Therefore, it is intended that this invention encompass all such variations and modifications as fall within the scope of the appended claims.

We claim:

1. A method for forming a conductive interconnect in an integrated circuit comprising the steps of:
    providing a semiconductor substrate;
    forming a dielectric layer overlying the semiconductor substrate;
    forming a conductive metal layer overlying the dielectric layer;
    forming a silicon adhesion layer overlying the conductive metal layer;
    forming an inorganic anti-reflective layer overlying the silicon adhesion layer;
    etching the inorganic anti-reflective layer to form a remaining portion of the inorganic anti-reflective layer; and
    etching the conductive metal layer to form the conductive interconnect, wherein the remaining portion of the inorganic anti-reflective layer overlies the conductive interconnect.

2. The method of claim 1, wherein the step of forming the inorganic anti-reflective layer is further characterized as forming a layer comprising silicon and nitrogen.

3. The method of claim 1, wherein the step of forming the silicon adhesion layer is further characterized as forming an amorphous silicon layer.

4. The method of claim 1, wherein the step of forming the silicon adhesion layer is further characterized as forming a polysilicon layer.

5. The method of claim 1, wherein the step of forming the conductive metal layer is further characterized as forming a metal silicide layer.

6. The method of claim 1, wherein the step of forming the conductive metal layer is further characterized as forming a conductive layer of material comprising a metal selected from the group consisting of tungsten, molybdenum, titanium, and cobalt.

7. The method of claim 1, wherein the step of forming the inorganic anti-reflective layer is further characterized as forming a silicon rich silicon nitride layer.

8. A method for forming a conductive interconnect in an integrated circuit comprising the steps of:
   providing a semiconductor substrate;
   forming a dielectric layer overlying the semiconductor substrate;
   forming a metal layer overlying the dielectric layer;
   forming a silicon adhesion layer overlying the metal layer;
   forming a layer comprising silicon and nitrogen overlying the silicon adhesion layer;
   etching the layer comprising silicon and nitrogen to form a remaining portion of the layer comprising silicon and nitrogen; and
   etching the metal layer to form the conductive interconnect, wherein the remaining portion of the layer comprising silicon and nitrogen overlies the conductive interconnect.

9. The method of claim 8, further comprising the step of forming a doped silicon layer overlying the dielectric layer and underlying the metal layer.

10. The method of claim 9, wherein the step of forming the doped silicon layer is further characterized as forming a doped polysilicon layer.

11. The method of claim 9, wherein the step of forming the doped silicon layer comprises depositing a layer of amorphous silicon.

12. The method of claim 8, wherein the step of forming the metal layer is further characterized as forming a silicide layer comprising a metal selected from a group consisting of tungsten, titanium, molybdenum, and cobalt.

13. The method of claim 8, wherein the step of forming the silicon adhesion layer is further characterized as forming a polysilicon layer.

14. The method of claim 8, wherein the step of forming the silicon adhesion layer is further characterized as forming an amorphous silicon layer.

15. The method of claim 8, wherein the step of forming the dielectric layer is further characterized as forming a gate dielectric layer.

16. The method of claim 8, wherein the step of forming the layer comprising silicon and nitrogen is further characterized as forming a silicon rich silicon nitride anti-reflective layer.

17. A method for forming a conductive interconnect in an integrated circuit comprising the steps of:
   providing a semiconductor substrate;
   forming a dielectric layer overlying the semiconductor substrate;
   forming a polysilicon layer overlying the dielectric layer;
   forming a tungsten silicide layer overlying the polysilicon layer;
   forming an amorphous silicon adhesion layer overlying the tungsten silicide layer;
   forming an anti-reflective layer comprising silicon and nitrogen overlying the amorphous silicon adhesion layer;
   etching the anti-reflective layer to form a remaining portion of the anti-reflective layer; and
   etching the polysilicon layer to form the conductive interconnect, wherein the remaining portion of the anti-reflective layer overlies the conductive interconnect.

18. The method of claim 17, further comprising the step of annealing the tungsten silicide layer prior to forming the anti-reflective layer.

19. The method of claim 17, wherein the step of forming the anti-reflective layer is further characterized as forming a layer of silicon oxynitride.

20. The method of claim 17, wherein the step of forming the anti-reflective layer is further characterized as forming a layer of silicon nitride.

21. The method of claim 17, wherein the step of forming the anti-reflective layer is further characterized as forming a layer of silicon-rich silicon nitride.

22. The method of claim 17, further comprising the step of depositing an oxide layer overlying the anti-reflective layer.

* * * * *